(12) United States Patent
Namihira

(10) Patent No.: US 6,950,899 B2
(45) Date of Patent: Sep. 27, 2005

(54) ASSOCIATIVE MEMORY DEVICE RETURNING SEARCH RESULTS OF A PLURALITY OF MEMORY GROUPS SUCCESSIVELY UPON ONE SEARCH INSTRUCTION

(75) Inventor: Daisuke Namihira, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 309 days.

(21) Appl. No.: 10/348,838

(22) Filed: Jan. 22, 2003

(65) Prior Publication Data

US 2004/0010657 A1    Jan. 15, 2004

(30) Foreign Application Priority Data

Jul. 12, 2002    (JP) ............................. 2002-204561

(51) Int. Cl.[7] .................. G06F 12/00; G11C 15/00
(52) U.S. Cl. .................. 711/108; 711/170; 711/173; 365/49
(58) Field of Search .................. 711/108, 170, 173; 365/49

(56) References Cited

U.S. PATENT DOCUMENTS

| | | | |
|---|---|---|---|
| 6,515,998 B1 * | 2/2003 | Yamashita et al. | 370/401 |
| 6,745,280 B2 * | 6/2004 | Darnell et al. | 711/108 |
| 6,757,779 B1 * | 6/2004 | Nataraj et al. | 711/108 |
| 6,826,180 B1 * | 11/2004 | Bergantino et al. | 370/389 |
| 2002/0075714 A1 * | 6/2002 | Pereira et al. | 365/49 |

FOREIGN PATENT DOCUMENTS

JP    57-74888    5/1982

* cited by examiner

Primary Examiner—Gary Portka
Assistant Examiner—Jasmine Song
(74) Attorney, Agent, or Firm—Katten Muchin Rosenman LLP

(57) ABSTRACT

Data stored in a memory of an associative memory device is input therein as a key. The memory includes entries divided logically in a plurality of groups. The associative memory device returns an address at which the key is stored. In this course, upon one search instruction, at least one of the groups of the entries are designated to be searched so that search results of the groups are returned successively.

16 Claims, 12 Drawing Sheets

FIG.7

| INSTRUCTION CODE PART | SEARCH OBJECT MEMORY GROUP DESIGNATION PART |

ASSOCIATIVE MEMORY DEVICE
RETURNING SEARCH RESULTS OF A
PLURALITY OF MEMORY GROUPS
SUCCESSIVELY UPON ONE SEARCH
INSTRUCTION

BACKGROUND OF THE INVENTION

1. Field of the Invention

The present invention generally relates to a memory device and an intermediary apparatus using the memory device and, more particularly, to an associative memory device and an intermediary apparatus using the associative memory device which receives a key that is input for retrieving data stored in a memory, and returns an address at which the key is stored.

2. Description of the Related Art

A CAM is used in an intermediary apparatus for a network, which is required to perform various searches, such as a destination search, a priority search and a filtering search. The CAM (Content Addressable Memory), i.e., an associative memory device, realizes a function of inputting data, which is stored in a memory (a CAM entry), as a key, and returning an address of the CAM entry at which the key is stored.

A function realized by a conventional CAM is receiving a search key as an input, and returning one address of a CAM entry which matches the key. Besides, when a plurality of CAM entries match the search key, normally only a lowest-numbered address is returned as a search result, although it is informed that the search key matches a plurality of the CAM entries.

Under this circumstance, a CAM is frequently used for searches, including a destination search, a priority control and a filtering, performed in an intermediary apparatus for a network, especially a router relaying an IP (Internet Protocol) packet, and a layer 2 switch switching a MAC (Media Access Control) frame of Ethernet prescribed by IEEE802.3 in a LAN (Local Area Network); when performing all these search processes by an existent CAM, each search is performed separately because only one search result can be returned for one search operation. In other words, a plurality of searches are performed for one frame or one packet.

Conventionally, for such reasons as a short search key length, inputting one search operation takes only a time of $1\tau$ ($\tau$ represents one clock cycle). Recently, however, the search key length for a CAM has become increased as an intermediary apparatus for a network has become multifunctional, as a result of which a search key needs to be divided into a plurality of keys upon being input; therefore, inputting one search operation has come to take a time of $n\tau$ (n represents a number larger than 1). FIG. 1 shows a signal timing chart of an example in which one search input (a search instruction) takes $4\tau$ because the search key is divided into four.

Accordingly, when a number of searches are performed to a same CAM, it takes {the time required for inputting one search operation} times {the number of the searches}; consequently, it is not practical to perform a number of searches in a single CAM because a search time is a vital factor in an intermediary apparatus dealing with an ultra high-speed line. FIG. 2 shows a signal timing chart of an example in which three searches are performed when one search input takes $4\tau$.

Alternatively, preparing one CAM exclusively for each of a plurality of searches, and executing a plurality of CAMs in parallel while each CAM performs one search, improves a performance thereof.

However, when a plurality of CAMs are mounted, control chips also need to be mounted so as to connect respective CAMs with one another; this increases a mounting area. Alternatively, when a plurality of CAMs are controlled by a single control chip, there also occurs a problem that the control chip requires an increased number of pins, and becomes complicated to control. Besides, in either method, the number of mounted chips becomes larger; this imposes a considerable disadvantage in pricing an apparatus on which the chips are mounted.

Besides, a description will be given, with reference to FIG. 3, of a conventional intermediary apparatus. This intermediary apparatus performs three searching processes regarding a destination, a flow type and a filtering. First, in a header analyzer 51, header information is extracted from each frame supplied via a port, and is attached to the frame.

Next, in a destination determiner 52, the header information is supplied to a destination information storage CAM 53 connected thereto so as to obtain destination information, and the destination information is attached to the frame. Subsequently, in a flow type determiner 54, the header information is supplied to a flow type storage CAM 55 connected thereto so as to obtain a flow type, and the flow type is attached to the frame. Subsequently, in a filtering processor 56, the header information is supplied to a filtering information storage CAM 57 connected thereto so as to obtain filtering information. In the filtering processor 56, when the filtering information indicates that the frame is to be filtered, the frame is discarded so that the frame is not to be relayed to a subsequent stage.

Further, in a queue controller 58 at the subsequent stage, a priority control is performed according to priority information indicated by the flow type attached to the frame. An in-apparatus switch 59 switches the frame to a destination indicated by the destination information attached to the frame. Besides, in an internal header remover 60 subsequent to the in-apparatus switch 59, the header information, the destination information and the flow type are detached from the frame, and the frame is transmitted via the port.

Thus, the conventional intermediary apparatus includes the destination information storage CAM 53, the flow type storage CAM 55 and the filtering information storage CAM 57 which are mounted thereon; and the conventional intermediary apparatus also needs to include control chips of the destination determiner 52, the flow type determiner 54 and the filtering processor 56 which control the respective CAMs. Consequently, the conventional intermediary apparatus has to have a large mounting area. Besides, even when these control chips are replaced with a single control chip controlling all of the above-mentioned CAMs, the single control chip needs to include interfaces with the respective CAMs. Thus, the number of pins required in the conventional intermediary apparatus is increased, imposing a considerable disadvantage on a cost of the conventional intermediary apparatus. Further, even with the single control chip, search processes are performed separately in the respective CAMs; thus, the mounting area is not decreased.

SUMMARY OF THE INVENTION

It is a general object of the present invention to provide an improved and useful associative memory device and an intermediary apparatus using the associative memory device in which the above-mentioned problems are eliminated.

A more specific object of the present invention is to provide an associative memory device and an intermediary apparatus using the associative memory device which can operate at a high speed, and can be easily mounted.

In order to achieve the above-mentioned objects, there is provided according to one aspect of the present invention an associative memory device including a memory including entries divided logically in a plurality of groups, an instruction decoder decoding a search instruction designating at least one of the groups to be searched so as to generate a group signal designating each of the groups to be searched and an enable signal, wherein the group signal, the enable signal and the key are supplied to the memory so as to search each of the groups designated by the group signal, and return each of search results successively.

According to the present invention, the search results of a plurality of the groups can be returned successively upon one search instruction input. This enables a high-speed searching operation.

Additionally, in the associative memory device according to the present invention, the search instruction may include a search object group designation part designating at least one of the groups to be searched.

According to the present invention, groups to be searched can be designated upon each search instruction input.

Additionally, the associative memory device according to the present invention may further include a search object group storage storing beforehand a designation of at least one of the groups to be searched.

According to the present invention, the groups designated beforehand to be searched can be searched.

Additionally, in the associative memory device according to the present invention, the group designated by the search object group designation part to be searched may be searched when the search object group designation part designates the group to be searched even though the search object group storage stores beforehand the designation of the group to be searched.

According to the present invention, the group designated by the search object group designation part of the search instruction can be searched with priority.

Additionally, in the associative memory device according to the present invention, the search instruction may be provided successively a plurality of times so as to designate an order of returning the search results of at least one of the groups designated to be searched.

According to the present invention, the order of returning the search results can be designated variously.

Additionally, in the associative memory device according to the present invention, the search object group storage may store beforehand a designation of an order of returning the search results of at least one of the groups designated to be searched.

According to the present invention, the order of returning the search results can be designated variously.

Additionally, in the associative memory device according to the present invention, the search results may be returned in an order designated by the search instruction when the search instruction designates the order even though the search object group storage stores beforehand the designation of the order of returning the search results.

According to the present invention, the search results can be returned in the order designated by the search instruction with priority.

Additionally, in the associative memory device according to the present invention, each of the entries may include a group storage storing information identifying the memory group to which the entry belongs.

According to the present invention, settings, such as the number of groups, the number of entries in each group, and the memory group to which each entry belongs, can be changed freely.

Additionally, in the associative memory device according to the present invention, each of the entries may include an entry storage storing a key of the entry.

According to the present invention, the key of each entry can be changed freely.

Other objects, features and advantages of the present invention will become more apparent from the following detailed description when read in conjunction with the accompanying drawings.

BRIEF DESCRIPTION OF THE DRAWINGS

FIG. 7 is a diagram showing an embodiment of an instruction input supplied to the instruction decoder;

DETAILED DESCRIPTION OF THE PREFERRED EMBODIMENTS

A description will now be given, with reference to the drawings, of embodiments according to the present invention.

Figure 4:
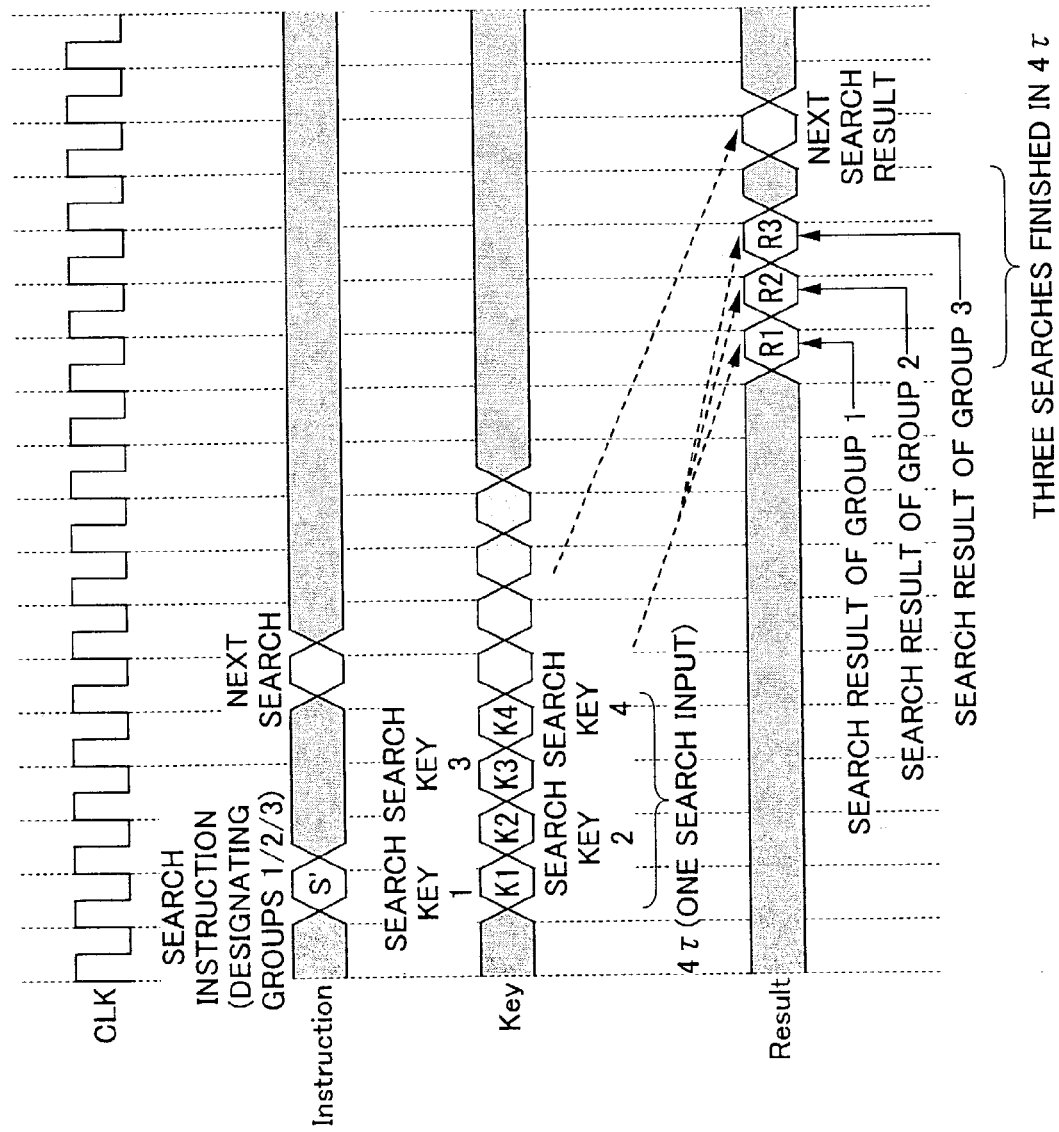
FIG. 4 is a signal timing chart of an associative memory device according to the present invention.

The present invention enables a CAM to perform a function of returning all of search results for a plurality of designated memory groups in order upon one search operation. For example, assuming that inputting a search key upon one search input takes $4\tau$, and that a destination search, a priority search and a filtering search are performed upon one search input, entry data for the destination search is defined as a memory group 1, entry data for the priority search is defined as a memory group 2, and entry data for the filtering search is defined as a memory group 3. In this example, as shown in a signal timing chart of FIG. 4, by providing a designation causing the searches to be performed for the memory groups 1, 2 and 3, i.e., causing search results for the memory groups 1, 2 and 3 to be returned in order upon one search input, the above-mentioned three searches are finished in the time of 4τ for each frame.

Figure 1:
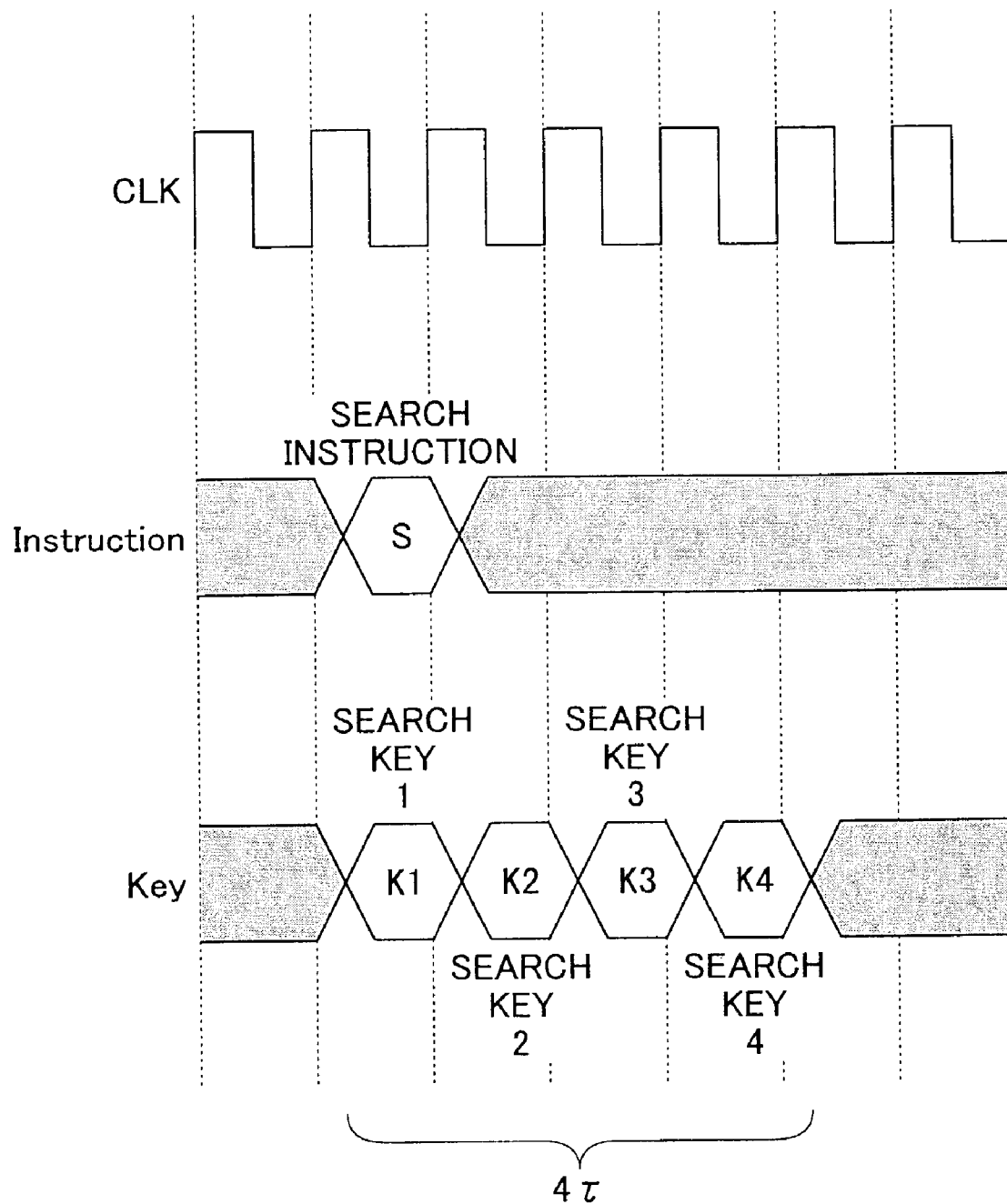
FIG. 1 is a signal timing chart of an example in which a search key is divided into four.
Figure 2:
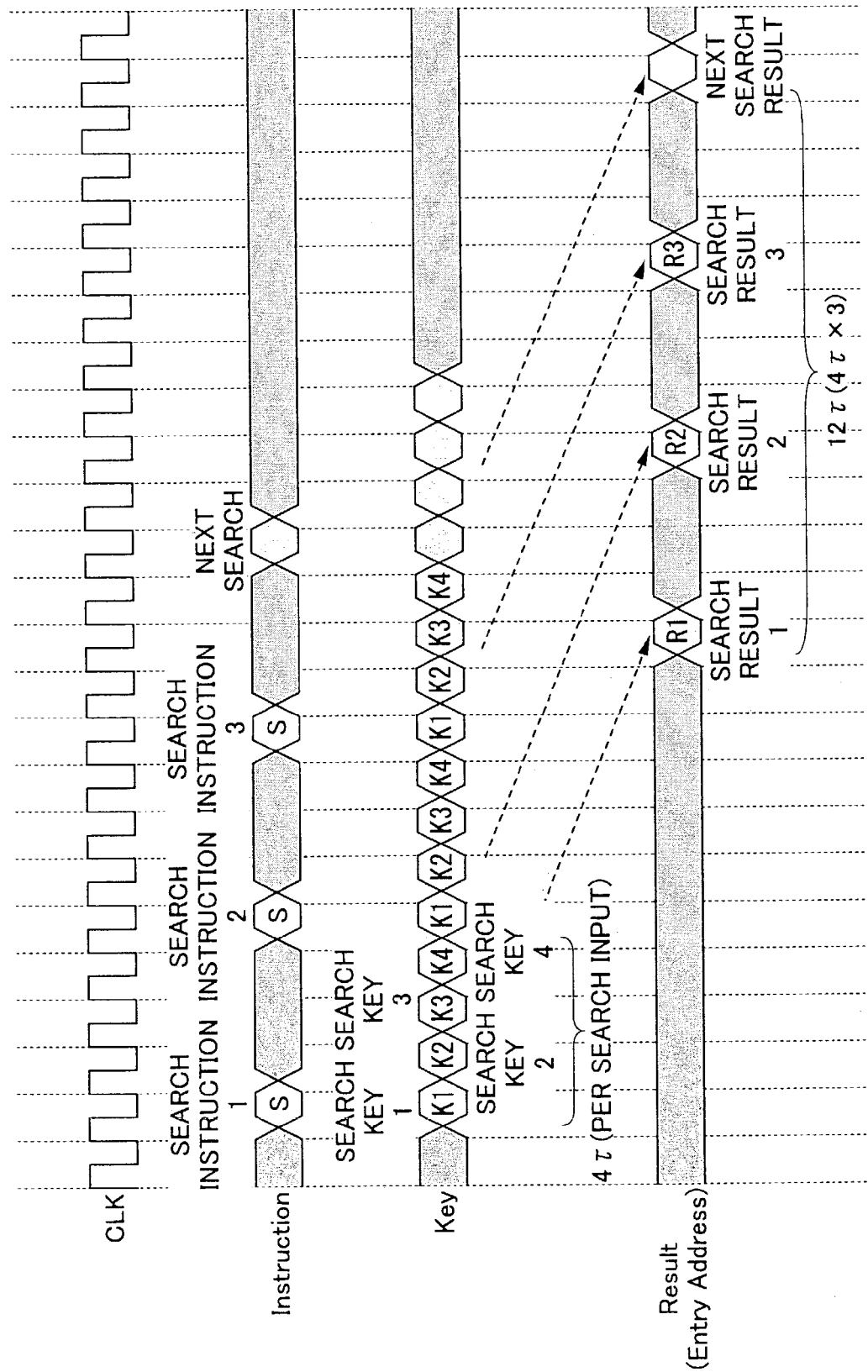
FIG. 2 is a signal timing chart of an example in which three searches are performed when one search input takes $4\tau$.

Besides, when performing the same searches with the conventional CAM, it takes {the time required for inputting one search operation} times {the number of the searches}, totaling 12τ, as shown in FIG. 2. The time differential therebetween becomes larger as the number of search objects increases.

Figure 5:
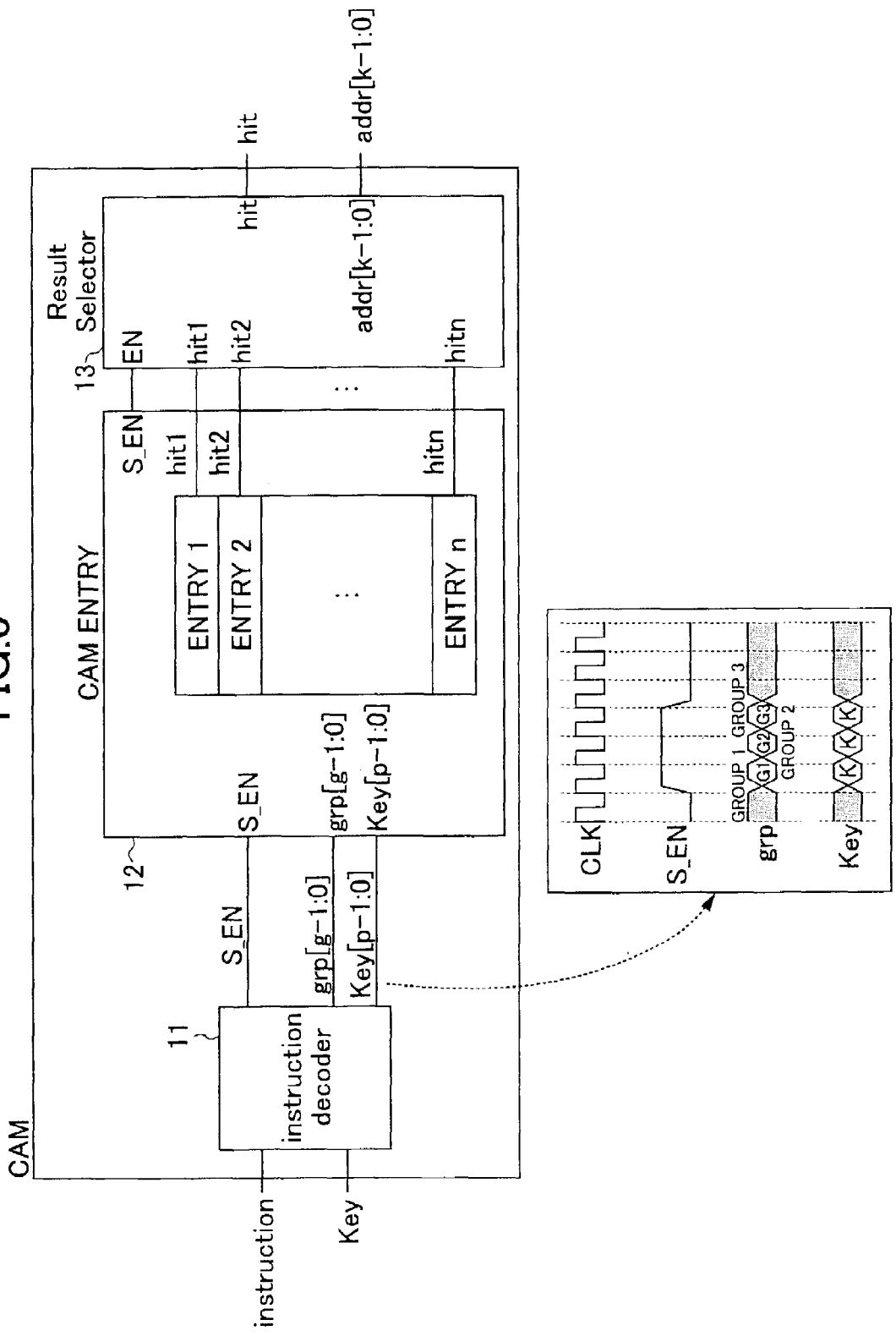
FIG. 5 is a diagram showing an overall configuration of an embodiment of the associative memory device according to the present invention.

FIG. 5 is a diagram showing an overall configuration of an embodiment of an associative memory device (a CAM) realizing the above-described function according to the present invention. In the following example, the number of CAM entries is n (=$2^k$), the number of memory groups is g, and the key length of a search key is p.

In FIG. 5, in an instruction decoder 11, when an input instruction (an instruction code) is a search instruction, an output enable signal S_EN is enabled ("1" represents "enable"). At this point, in the conventional CAM, S_EN becomes enabled for 1τ upon one search instruction, or becomes enabled for a duration corresponding to one search; by contrast, in the associative memory device according to the present invention, S_EN is enabled for periods corresponding to the number of the memory groups as search objects. Additionally, the memory groups to be searched according to the respective "enable" periods are designated for respective group signals grp corresponding to the respective "enable" periods; this realizes a mechanism in which respective results for a plurality of the designated memory groups are treated as search objects in order.

FIG. 5 includes, at a lower part thereof, a signal timing chart of a case where the memory groups 1, 2 and 3 are searched for upon one search instruction. In this case, since the number of the memory groups as search objects is three, the enable signal S_EN is made "1" for periods of 3τ, and the memory groups 1, 2 and 3 are designated in the periods of 3τ in order.

Accordingly, in a subsequent stage, a plurality of searches are performed. This realizes the mechanism in which, upon one search input, the designated memory groups are searched for in order, and respective search results are returned in order.

In the above-described example, the group signal grp output by the instruction decoder 11 is a g-bit signal, which is used to designate search objects by giving "1" to a bit corresponding to a memory group as a search object. Other methods for designating memory groups include a method of numerically designating memory groups. For example, when the number of memory groups is 16, the group signal grp is arranged to be a 4-bit signal, which is used to designate, for example, the memory group 3 by becoming "0b0011" (0b indicates a binary notation). Besides, a detailed configuration for designating memory groups upon search input and for outputting the signal S_EN and the signal grp is described hereinafter with reference to detailed configuration diagrams.

In the subsequent stage, each entry data is present in a CAM entry 12 that is a memory. Upon a search operation, i.e., when the signal S_EN becomes "enable", the CAM entry 12 compares each entry belonging to a memory group designated by the signal grp with a supplied key {Key}, and outputs a hit signal {hitn}.

Whereas a plurality of search designations are made in the instruction decoder 11, the comparison upon the search per se can be performed in a same manner as in a conventional CAM. Besides, a method of detecting an entry belonging to a memory group designated by the signal grp, and a method of searching only the entry per se, are described hereinafter with reference to detailed configuration diagrams.

A result selector 13 selects one result from among a total of n hit signals {hitn} output from each entry upon the "enable" designation by the enable signal S_EN, and outputs an address of the entry. The result selector 13 can be realized with a same structure as in a conventional CAM. Whereas a plurality of search designations are output from the instruction decoder 11, a conventional manner suffices for returning one result for each "enable" designation by the enable signal; therefore, a detailed description thereof will be omitted.

Next, a description will be given of detailed configurations of each of the elements of the present invention.

Figure 6:
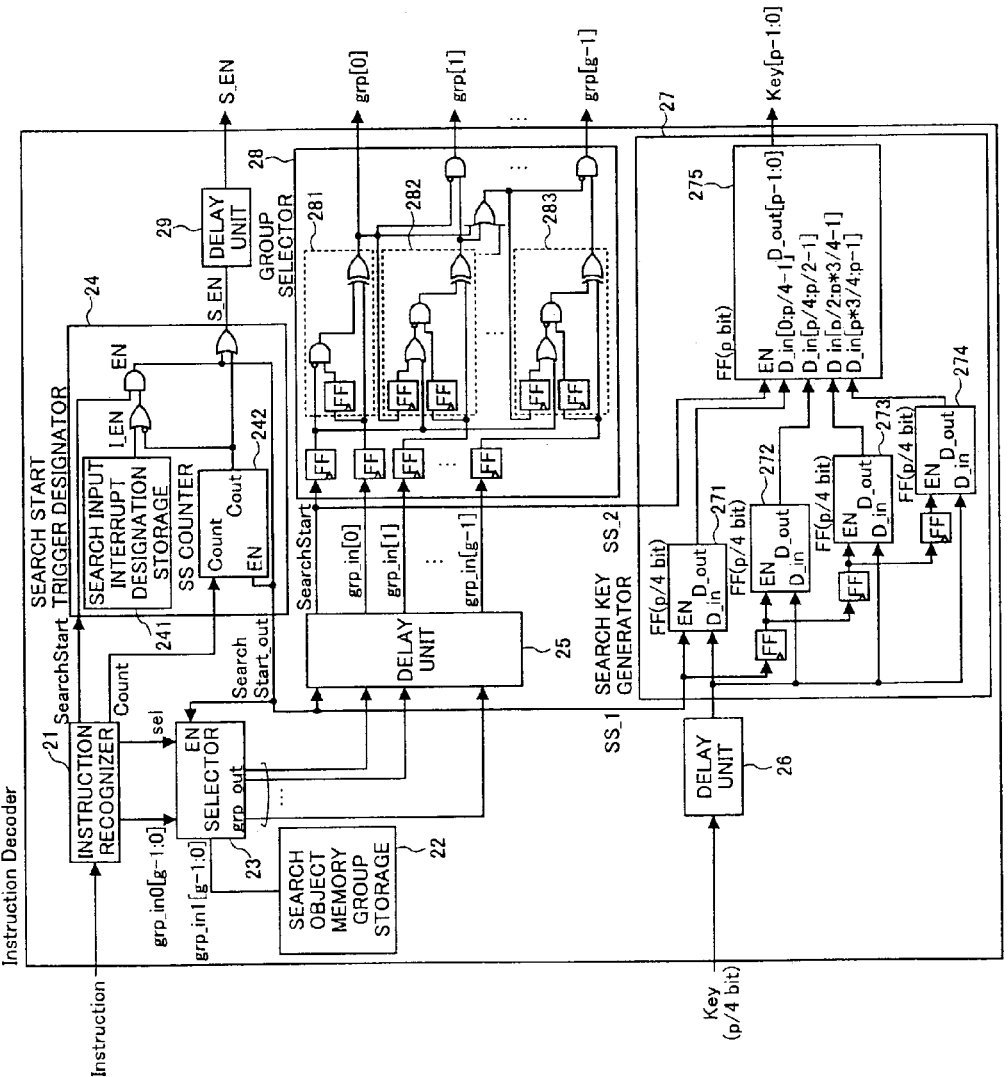
FIG. 6 is a block diagram of a first embodiment of an instruction decoder shown in FIG. 5.

FIG. 6 is a block diagram of a first embodiment of the instruction decoder 11. As shown in FIG. 6, an instruction recognizer 21 receives an instruction input (a search instruction), and provides proper directions to subsequent stages. FIG. 7 shows an embodiment of the above-mentioned instruction input. As shown in FIG. 7, the instruction input includes an instruction code part and a search object memory group designation part (a search object group designation part). The instruction code part contains a code number of a variety of commands, such as searching or entry-storing. Since the present invention relates to searching (retrieving), the following descriptions will be made only on search instruction codes. There are two types of the search instruction codes as follows.

Search instruction 1: a search instruction that designates a memory group designated in the search object memory group designation part of the instruction input, as a search object.

Search instruction 2: a search instruction that designates a content of a search object memory group storage (a search object group storage) 22 (shown in FIG. 6) as a search object.

The search object memory group designation part of the instruction input is a part for designating a memory group as a search object. In one method of designating a memory group, the memory groups are mapped to respective bits of the search object memory group designation part, and a memory group to be a search object is designated by giving "1" to a bit corresponding to the memory group. For example, when the memory groups 1, 2 and 3 are to become search objects, the (three) bits corresponding to these memory groups are made "1".

The above-described instruction code is received by the instruction recognizer 21 shown in FIG. 6. When the instruction code part of the instruction input indicates a search instruction, the instruction recognizer 21 causes a search start signal to be "1" only for 1τ. Additionally, the instruction recognizer 21 calculates {the number of bits minus 1} which are "1" among the bits in the search object memory group designation part, and outputs a calculated value to a count signal {Count}. For example, when four memory groups are designated, and four search results are to be returned, the value of the count signal becomes "3".

Alternatively, the search designation and the number of search results to be returned may be input in the instruction code part of the instruction input, and the instruction recognizer 21 outputs {the number minus 1} as the count signal. When the instruction input {Instruction} includes the above-mentioned search instruction 1, the instruction recognizer 21 supplies a selector 23 with a select signal {sel} being "0"; when the instruction input {Instruction} includes the above-mentioned search instruction 2, the instruction recognizer 21 supplies the selector 23 with the select signal {sel} being "1". The select signal {sel} is used in a judgment for selecting the search object memory groups.

Finally, the instruction recognizer 21 outputs the content of the search object memory group designation part as a signal grp_in0{g-1:0} to the selector 23.

The search object memory group storage 22 stores contents of search object memory groups which are used when search object memory groups are not set in the instruction input (i.e., when the search instruction 2 is designated). The contents of the search object memory groups can be designated from a user. The contents thereof are always output as a signal grp_in1{g-1:0} to the selector 23.

When an enable signal EN is "1", and the select signal {sel} is "0", the selector 23 outputs the signal grp_in0{g-1:0} as a signal grp_out. When the enable signal EN is "1", and the select signal {sel} is "1", the selector 23 outputs the signal grp_in1{g-1:0} as the signal grp_out. On the other hand, when the enable signal EN is "0", the selector 23 retains a content that is output last time the enable signal EN is "1". Accordingly, it can be designated according to the types of the search instructions whether to use the search object memory groups set in the instruction input or the search object memory groups stored in the search object memory group storage 22.

A search start trigger designator (a search start designator) 24 judges whether or not to accept a next search instruction when the next search instruction is supplied before the execution of a current search instruction is completed, for example when the next search instruction is supplied after 5τ of 10τ corresponding to 10 search object memory groups designated by the current search instruction.

A search input interrupt designation storage (a search input interrupt designator) 241 stores a user's designation as to whether or not to accept a next search instruction before the execution of a current search instruction is completed, and to cause the next search instruction to interrupt the current search instruction. When the user's designation indicates that the next search instruction is to be accepted, the search input interrupt designation storage 241 makes an enable signal I_EN "1". When the user's designation indicates that the next search instruction is not to be accepted, the search input interrupt designation storage 241 makes the enable signal I_EN "0".

When the enable signal EN is "1", an SS counter 242 stores therein an input {Count} (the count signal) input from the instruction recognizer 21. After 1τ, the SS counter 242 starts making an output {Cout} "1" until the stored input {Count} becomes "0". Thus, the output {Cout} delays by 1τ because storing the input content takes 1τ. Therefor, {the number of search results to be returned minus 1} is input as the input {Count} (the count signal) so as to compensate for the difference of 1τ between the input of the input {Count} and the output start of the output {Cout}.

The enable signal EN is a result of obtaining an OR (logical addition) between the signal I_EN and a NOT (negation) of the output {Cout}, and then obtaining an AND (logical product) between the OR (logical addition) and the search start signal supplied from the instruction recognizer 21. First, with regard to obtaining the OR (logical addition) between the signal I_EN and the NOT (negation) of the output {Cout}, only when the output {Cout} is "1" (i.e., a time required for returning current search results has not elapsed yet), and the signal I_EN is "0" (i.e., a next search instruction is not to be accepted before the execution of a current search instruction is completed), the OR (logical addition) becomes "0".

In this case, the AND (logical product) between the OR (logical addition) and the search start signal becomes "0". That is, when the next search instruction is not to be accepted before the execution of the current search instruction is completed, the signal EN (a search-start out signal) becomes "0" even though the search start signal is supplied; thus, the next search instruction is ignored so as to reject the acceptance of a search start instruction.

Besides, an OR (logical addition) between the search-start out signal and the output {Cout} is output as the enable signal S_EN; thus, "1" starts to be output upon the search start instruction, and continues to be output during the number of clocks corresponding to the number of search results to be returned; thus, a search instruction is provided for the subsequent stage. In addition, since the output {Cout} of the SS counter 242 does not become "1" upon the input of the search-start out signal (the previous content being output), the OR (logical addition) between the search-start out signal and the output {Cout} is output as the enable signal S_EN so that "1" is output as the signal S_EN upon the input of the search-start out signal.

Since the search key cannot be input in 1τ, a delay unit 25 delays each of the signals until the input of the search key is completed. A delay unit 26 delays the search key input by a time from the instruction input until the output of the search start signal.

A search key generator 27 retains each of partial inputs of the search key, and transmits all of the partial inputs of the search key to the subsequent step after all of the partial inputs of the search key are supplied. FIG. 6 shows a structure of the search key generator 27 corresponding to a case where inputting the search key having the key length of p bits takes 4τ. Since the above-mentioned delay unit 26 delays the search key input so that the partial input of the search key corresponding to 1st τ is supplied to the search key generator 27 when a signal SS_1 (the search-start out) becomes "1", the first search key input (corresponding to first p/4 bits) is stored in a flip-flop 271. Each of flip-flops 271 to 274 is a flip-flop for p/4 bits, with the enable signal EN being supplied thereto. When the enable signal EN is "1", each of the flip-flops 271 to 274 latches a content of data D_in.

Next, upon supplying the partial input of the search key corresponding to 2nd τ, the signal SS_1, which is delayed by 1τ, becomes "enable" in the flip-flop 272; thus, the second search key input is stored in the flip-flop 272. Similarly, the third and fourth search key inputs corresponding to 3rd τ and 4th τ are stored in the flip-flops 273 and 274, respectively, in order.

The delay unit 25 delays the search-start out signal so that a search-start signal SS_2 becomes "1" after all of the search key inputs are stored; thus, when the search-start signal SS_2 becomes "1", all contents of the search key are stored in the flip-flops 271 to 274. All of these contents of the search key are supplied to a flip-flop 275 so that all of the contents of the search key having the p bits are stored in the flip-flop 275. Besides, the contents of the search key are output to a Key{p—1:0} until next time the search-start signal SS_2 becomes "1"

In a group selector 28, the search object memory groups supplied as signals grp_in are distributed as search objects for each cycle (τ) For example, when the search object memory groups are the memory groups 1, 2 and 3, only the signal grp corresponding to the memory group 1 is made "1" in 1st τ, only the signal grp corresponding to the memory group 2 is made "1" in 2nd τ, and only the signal grp corresponding to the memory group 3 is made "1" in 3rd τ. This distribution is performed so as to return a plurality of search results.

In the group selector 28, a circuit 281 obtains an XOR (exclusive logical addition) between the signal grp_in {0} and a 1τ-delayed signal (derived from an output signal of an FF (flip-flop)) delayed by 1τ from the signal grp_in{0}. Accordingly, when the signal grp_in{0} is "1", the XOR result becomes "1" only for 1τ. Additionally, the above-mentioned 1τ-delayed signal is a result of obtaining an AND (logical product) between a 1τ-delayed signal (the output signal of the FF) of the signal grp_in{0} and a NOT (negation) of the search start signal. Accordingly, when the search start signal is "1" (i.e., upon starting a new search operation), the AND result (the 1τ-delayed signal) becomes "0" so that the above-mentioned XOR result between the signal grp_in{0} and the 1τ-delayed signal always equals the signal grp_in{0}, and is output as the signal grp{0}. In other words, the signal grp{0} is reset by the search start signal. Accordingly, when the signal grp_in{0} is "1", the signal grp{0} becomes "1" only for 1τ during which the search start signal is "1".

A circuit 282 has basically the same structure as the circuit 281, except that an OR (logical addition) between a 1τ-delayed signal of the output of the circuit 281 and the search start signal is obtained. Accordingly, when the signal grp{0} is "1", the signal grp{1} is reset so that the signal grp_in{1} is output as the signal grp{1}. Accordingly, when the signal grp_in{1} is "1", and the signal grp{0} is "1", the output (the signal grp{1}) of the circuit 282 becomes "1" for 2τ. When the signal grp{0} is "0", the output (the signal grp{1}) of the circuit 282 becomes "1" only for 1τ.

Similarly, in a circuit 283, a 1τ-delayed signal of an OR (logical addition) result of the outputs of all of the preceding circuits (including the circuits 281 and 282) is supplied as a resetting signal. Accordingly, when the signal grp_in{g-1} is "1", and at least one of the signal grp{0} to the grp{g-2} is "1", the output (the signal grp{g-1}) of the circuit 283 necessarily becomes "1" so that the output of "1" continues for 1τ longer.

For example, when all of the signal grp_in{0}, the signal grp_in{1} and the signal grp_in{g-1} are "1", i.e., when the three memory groups 1, 2 and 3 corresponding to these respective signals grp_in are search objects, the outputs of the circuits 281, 282 and 283 become "1" in 1st τ, the outputs of the circuits 282 and 283 become "1" in 2nd τ, and the output of only the circuit 283 becomes "1" in 3rd τ.

In this course, the outputs of the circuits 282 and 283 are results of obtaining an AND (logical product) between the respective signals grp_in and NOTs (negations) of the outputs of the respective preceding circuits (the circuits 281 and 282); accordingly, when the outputs of the respective preceding circuits are "1", the outputs of the circuits 282 and 283 are reduced to "0". Accordingly, only the signal grp{0} becomes "1" in 1st τ, only the signal grp{1} becomes "1" in 2nd τ, and only the signal grp{g-1} becomes "1" in 3rd τ; consequently, the memory groups as search objects are output one by one in order.

Finally, a delay unit 29 delays the signal S_EN by a time required in the delay unit 25 and the group selector 28. Thereby, the output timing of the signals grp and the signal S_EN is adjusted. Thus, the enable signal S_EN becomes "1" during periods corresponding to the number of the memory groups as search objects, and the memory groups designated for searching are output as the signals grp one by one in order. Thus, the groups designated as search objects upon one search input can be designated to the subsequent stage in order.

Figure 8:
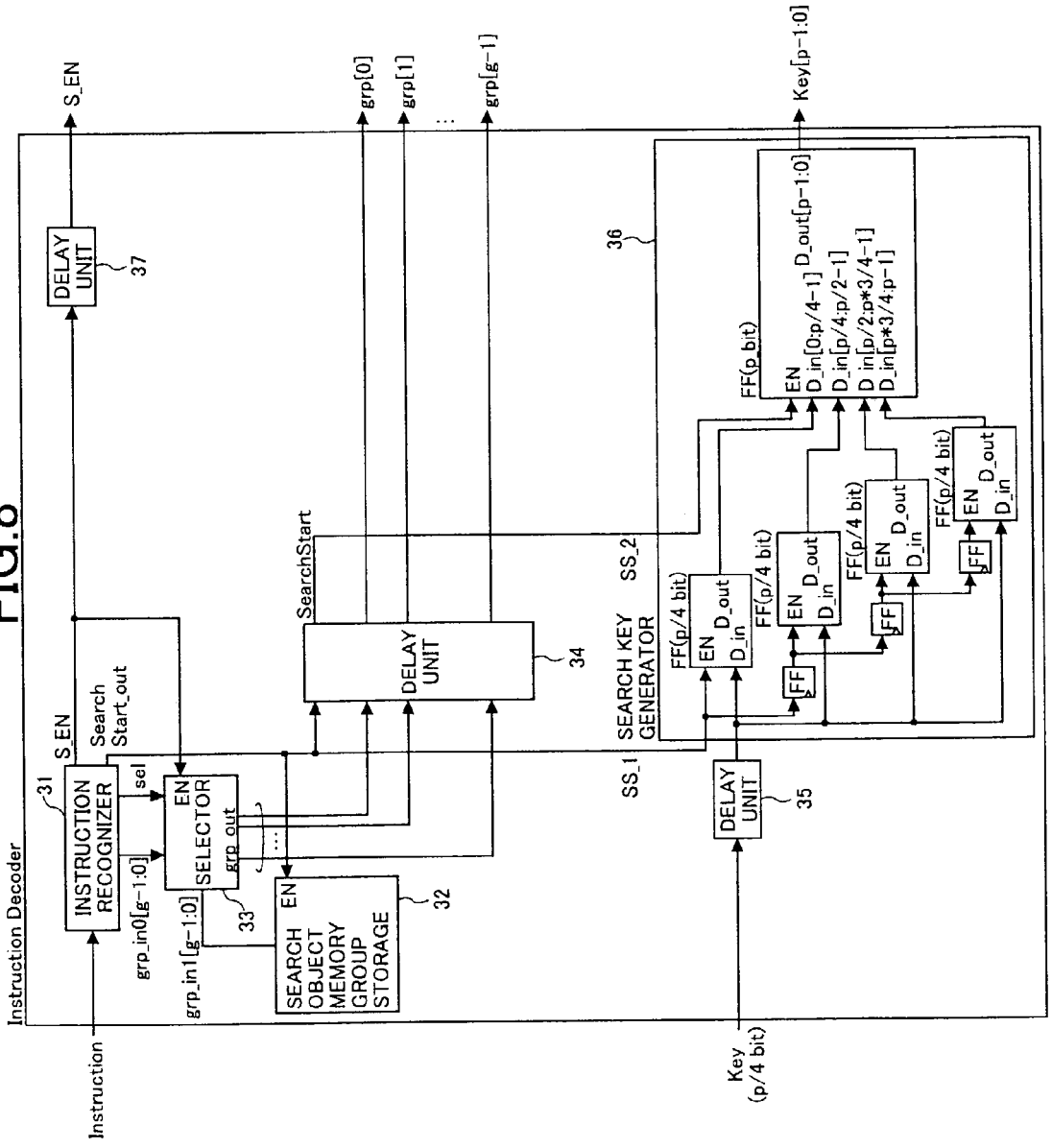
FIG. 8 is a block diagram of a second embodiment of the instruction decoder shown in FIG. 5.

FIG. 8 is a block diagram of a second embodiment of the instruction decoder 11. In the present second embodiment, the order of memory groups can be changed, for example, as follows: a search result corresponding to the memory group 2 is returned for 1st τ, a search result corresponding to the memory group 3 is returned for 2nd τ, a search result corresponding to the memory group 1 is returned for 3rd τ. Also in the present second embodiment, a search result corresponding to a plurality of memory groups can be returned for each period (τ), for example, as follows: a search result corresponding to the memory groups 1/2/3 is returned for 1st τ, a search result corresponding to the memory groups 2/3/4 is returned for 2nd τ, a search result corresponding to the memory groups 3/4/5 is returned for 3rd τ.

In the present second embodiment, contents of the instruction input are partially different from the contents of the instruction input in the foregoing first embodiment shown in FIG. 7. In the present second embodiment, there are four types of instruction codes regarding searching as follows.

Search instruction 1: a search instruction that designates a memory group designated in the search object memory group designation part of the instruction input, as a search object.

Memory group input instruction 2: an instruction that only designates a memory group designated in the search object memory group designation part of the instruction input as a search object, which is not a search instruction. (The memory group input instruction 2 follows the search instruction 1.)

Search instruction 3: a search instruction that designates a content of a search object memory group storage (a search object group storage) 32 (shown in FIG. 8) as a search object.

Memory group input instruction 4: an instruction that only designates a content of the search object memory group storage 32 as a search object, which is not a search instruction. (The memory group input instruction 4 follows the search instruction 3.)

Figure 9:
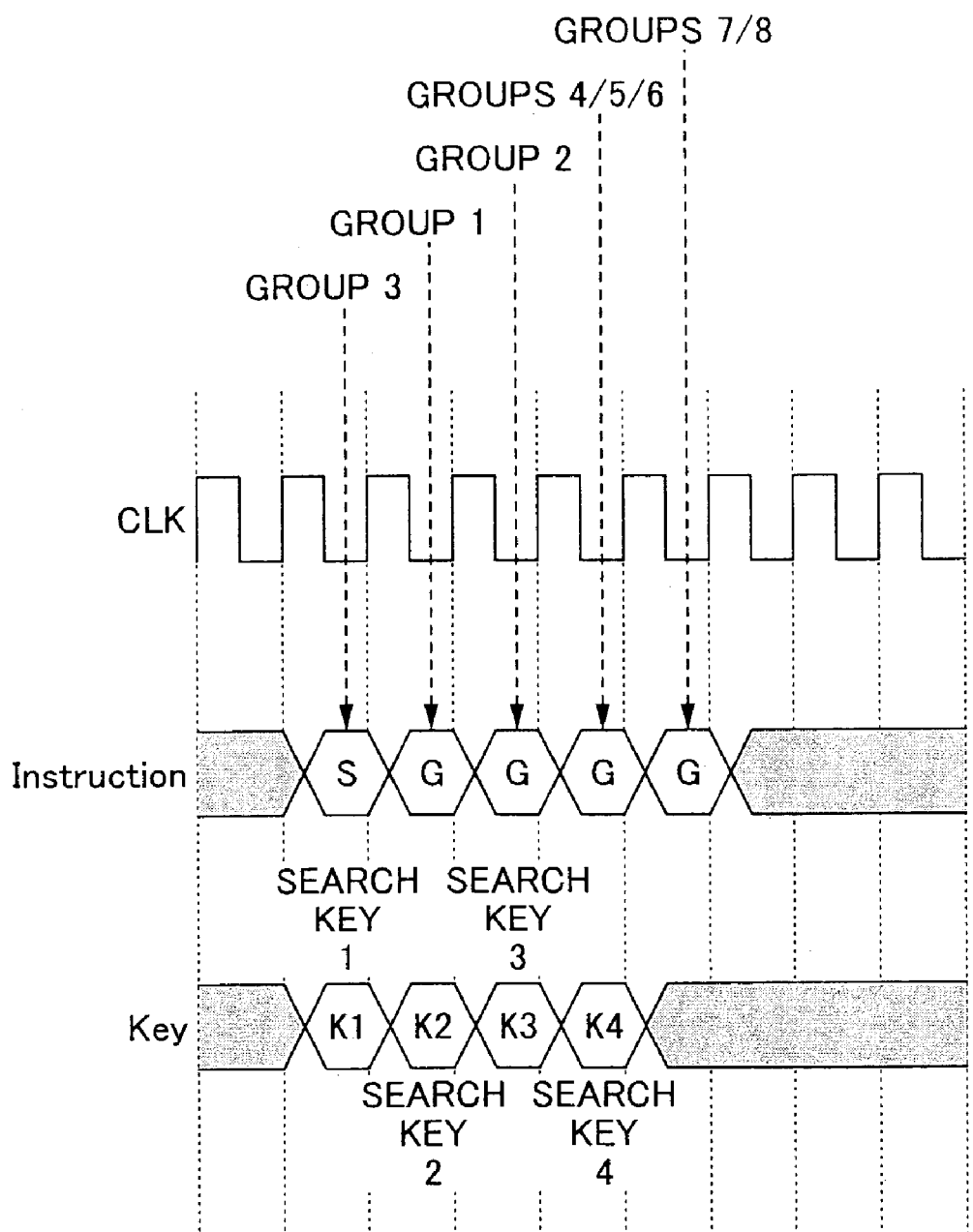
FIG. 9 is a signal timing chart of an embodiment of the instruction input.

Besides, the instruction input is so provided that search object memory group(s) are designated in each period (τ), as shown in FIG. 9. For example, in FIG. 9, the instruction input is provided in the following order: the search instruction 1 designating the memory group 3; the memory group input instruction 2 designating the memory group 1; the memory group input instruction 2 designating the memory group 2; the memory group input instruction 2 designating the memory groups 4/5/6; and the memory group input instruction 2 designating the memory groups 7/8.

Besides, the above-mentioned search object memory group(s) are designated in the search object memory group designation part of the instruction input shown in FIG. 7. Additionally, a plurality of memory groups are designated by making (a plurality of) bits corresponding to the respective memory groups "1".

An instruction recognizer 31 recognizes the above-mentioned four instructions. When the instruction is the search instruction 1 or 3, the instruction recognizer 31 causes a search start signal and a signal S_EN to be "1". When the instruction is the memory group input instruction 2 or 4, the instruction recognizer 31 causes only the signal S_EN to be "1". When the instruction is the search instruction 1 or the memory group input instruction 2 using the search object memory group designation part of the instruction input, the instruction recognizer 31 causes a select signal {sel} to be "0". When the instruction is the search instruction 3 or the memory group input instruction 4 using the search object memory group storage 32, the instruction recognizer 31 causes the select signal {sel} to be "1". Accordingly, either of the search object memory groups input upon each memory group input or the memory groups stored in the search object memory group storage 32 can be selected for each instruction (each period τ)

The search object memory group storage 32 includes areas for designating search object memory group(s) for each period (τ). For example, assuming that a maximum of m search results can be returned, the search object memory group storage 32 includes areas for storing m search object memory groups. When an enable signal EN becomes "1", the search object memory group storage 32 starts outputting contents of the search object memory groups from the corresponding area for each period (τ) successively, as a signal grp_in1{g-1:0}.

For example, assuming that the search object memory group storage 32 includes m areas {0 to m-1}, when the signal EN becomes "1", the search object memory group storage 32 outputs contents of the search object memory groups from the (storage) area 0 as the signal grp_in1{0}, and subsequently outputs contents of the search object memory groups from the storage area 1 as the signal grp_in1{1}. Similarly, after (m−1) periods (τ), the search object memory group storage 32 outputs contents of the search object memory groups from the storage area m-1 as the signal grp_in1{g-1}.

A selector 33 has the same structure as the selector 23. A delay unit 34 has the same structure as the delay unit 25. A delay unit 35 has the same structure as the delay unit 26. A search key generator 36 has the same structure as the search key generator 27. Therefore, detailed descriptions thereof will be omitted.

A delay unit 37 delays the signal S_EN for the same purpose as with the delay unit 29. In the present second embodiment, the delay unit 37 delays the signal S_EN by the same time as delayed in the delay unit 34. Thereby, the output timing of signals grp and the signal S_EN is adjusted. The signals grp are directly output from the delay unit 34, because the search object memory groups in the instruction input {Instruction} or the outputs from the search object memory group storage 32 are directly designated for each period (τ). Thus, a plurality of memory groups can be designated as search objects for each period (τ)

Besides, the foregoing first embodiment shown in FIG. 6 includes the search start trigger designator 24 for judging whether or not to accept a next search instruction when the next search instruction is supplied at an interval shorter than a time required for returning current search results. However, in the present second embodiment, the search object memory groups are designated in order upon each instruction input; therefore, a next search can be performed simply by an adjacent chip designating the search instruction as the instruction code in the instruction input.

In another embodiment aside from the above-described first and second embodiments of the instruction decoder 11, a search object memory group table may be prepared in the instruction decoder 11, and a part for designating an address in the search object memory group table may be provided in the instruction input in place of the search object memory group designation part. The search object memory group table stores search object memory groups. In this arrangement, the output of the selector 23 shown in FIG. 6 or the selector 33 shown in FIG. 8 does not indicate a memory group, but indicates the search object memory group table address. The output of the selector 23 or the selector 33 is used as a read address to the search object memory group table so as to read out a search object memory group stored at the read address. This output from the search object memory group table is supplied to the delay unit 25 or the delay unit 34 so as to realize the same functions as in the above-described first or second embodiment of the instruction decoder 11.

Figure 10:
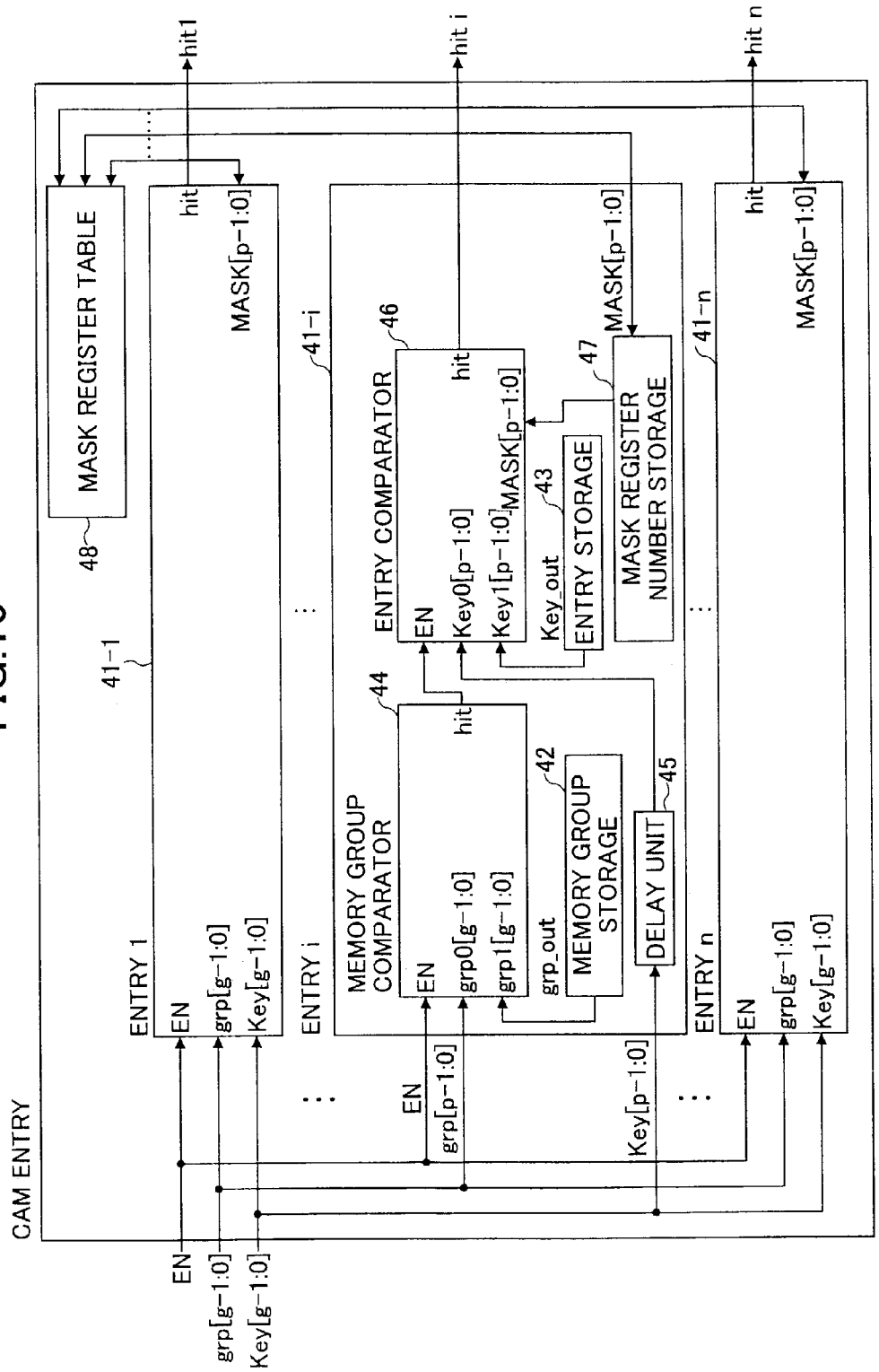
FIG. 10 is a block diagram of a first embodiment of a CAM entry shown in FIG. 5.

FIG. 10 is a block diagram of a first embodiment of the CAM entry 12. When the signal S_EN is "1", the CAM entry 12 compares an entry corresponding to a memory group designated by the signal grp{g-1:0} with a search key designated by the Key{p-1:0}; and when the entry matches the search key, the CAM entry 12 outputs a hit signal {hitn}.

As shown in FIG. 10, the CAM entry 12 includes n entries 41-1 to 41-n. An entry 41-i represents a detailed structure of an i-th entry. The signal S_EN, the signal grp{g-1:0} and the Key{p-1:0} are supplied to all of the entries 41-1 to 41-n; thus, the search instruction, the memory group and the search key are designated for all of the entries.

Next, a description will be given of the detailed structure of the entry 41-i. A memory group storage (a group storage) 42 stores a memory group to which each entry belongs. A content of the memory group can be freely set by a user. The content of the memory group is always supplied as a signal grp_out (grp1{g-1:0}) to a memory group comparator (a group comparator) 44.

An entry storage 43 stores a key (an entry) actually compared with the supplied search key. This entry storage 43 can also be freely set by a user. The content of the stored key is always supplied as a signal Key_out (Key1{p-1:0}) to an entry comparator 46.

When an enable signal EN (the signal S_EN) is "1", the memory group comparator 44 compares each bit of the signal grp{g-1:0} (grp0{g-1:0}) with a corresponding bit of the signal grp1{g-1:0}. When at least one bit of the signal grp0{g-1:0} and the corresponding bit of the signal grp1{g-1:0} are both "1", i.e., when the memory group stored in the memory group storage 42 is designated as a search object memory group, the memory group comparator 44 causes a signal {hit} to be "1" only for 1τ. The comparison in this course can be realized by obtaining an AND (logical product) between each bit of the signal grp0{g-1:0} and a corresponding bit of the signal grp1{g-1:0} and obtaining an OR (logical addition) among all of the AND results.

Accordingly, only when the memory group to which the present i-th entry belongs is designated as a search object memory group, the signal {hit} becomes "1".

A delay unit 45 delays the Key{p-1:0} by a time required in the memory group comparator 44. Thereby, the output timing of the signal {hit} of the memory group comparator 44 and the output timing of the Key{p-1:0} are adjusted.

A mask register number storage 47 stores a register number of a mask register used by the present entry 41-i, which can be freely set by a user. A mask register table 48 stores mask information used upon searching, in relation to the register number. The mask information can be freely set by a user.

The mask register number storage 47 retrieves the mask information corresponding to the stored register number from the mask register table 48, and supplies the mask information to the entry comparator 46. When an enable signal EN is "1", the entry comparator 46 compares the input Key{p-1:0} (Key0{p-1:0}) with the Key1{p-1:0} of the entry storage 43. When all bits of the Key0{p-1:0} and the Key1{p-1:0} match one another, the entry comparator 46 causes the signal {hit} to be "1" for 1τ.

In this course, the entry comparator 46 reads the mask information (MASK{p-1:0}) from the mask register number storage 47 so as not to perform a search for a bit designated to be masked. For example, the mask information (MASK{p-1:0}) being "1" designates the corresponding bit to be masked. That is, when the MASK{a} is "1", the entry comparator 46 does not perform a comparison between the Key0{a} and the Key1{a}; or the entry comparator 46 determines that bits {a} (the Key0{a} and the Key1{a}) match each other regardless of a comparison result.

Besides, although the present first embodiment of the CAM entry 12 sets forth the entry 41-i including the mask register number storage 47 storing the register number corresponding to the mask information, the entry 41-i may include an area for storing the mask information per se, and supply the mask information to the entry comparator 46.

In this structure, the signal {hit} is supplied from the memory group comparator 44 to the entry comparator 46 as the enable signal EN. Thus, in an entry (41-i) belonging to a memory group not designated as a search object memory group upon a search instruction, the enable signal EN supplied to the entry comparator 46 is not "1". Accordingly, for an entry (Key1) not belonging to a search object memory group, the entry comparator 46 does not perform the above-described comparison between the keys. This enables the above-described comparison to be performed only for an entry belonging to a search object memory group designated by the signal grp{g-1:0}.

Figure 11:
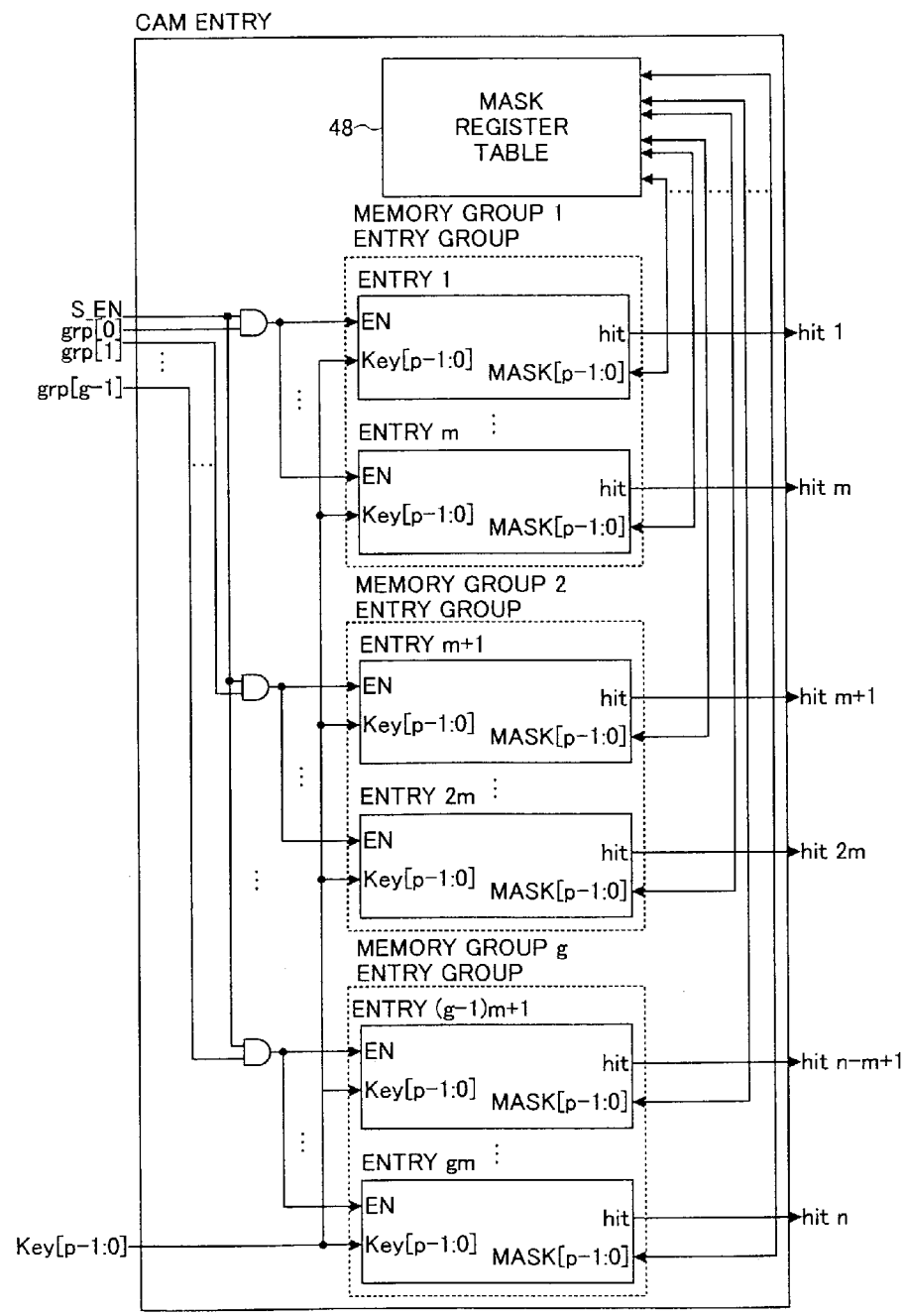
FIG. 11 is a block diagram of a second embodiment of the CAM entry shown in FIG. 5.

FIG. 11 is a block diagram of a second embodiment of the CAM entry 12. In the present second embodiment of the CAM entry 12, g·m entries are provided separately in g memory group entry groups. An AND (logical product) between the signal S_EN and each bit of the signal grp{1:0} (corresponding to each memory group) is obtained, and is supplied as the enable signal to each of the entries composing the corresponding memory group entry group. Thus, only the enable signal EN supplied to the corresponding memory group entry group belonging to a search object memory group becomes "1". Accordingly, only the designated search object memory group undergoes a search operation.

Each of the g·m entries has a structure including only the entry storage 43 and the entry comparator 46 shown in FIG. 10. That is, since the search object memory group is already designated, each of the g·m entries only performs the comparison between the keys. This structure is the same as applied in a conventional CAM.

Next, a description will be given of an intermediary apparatus using the associative memory device according to the present invention.

Figure 3:
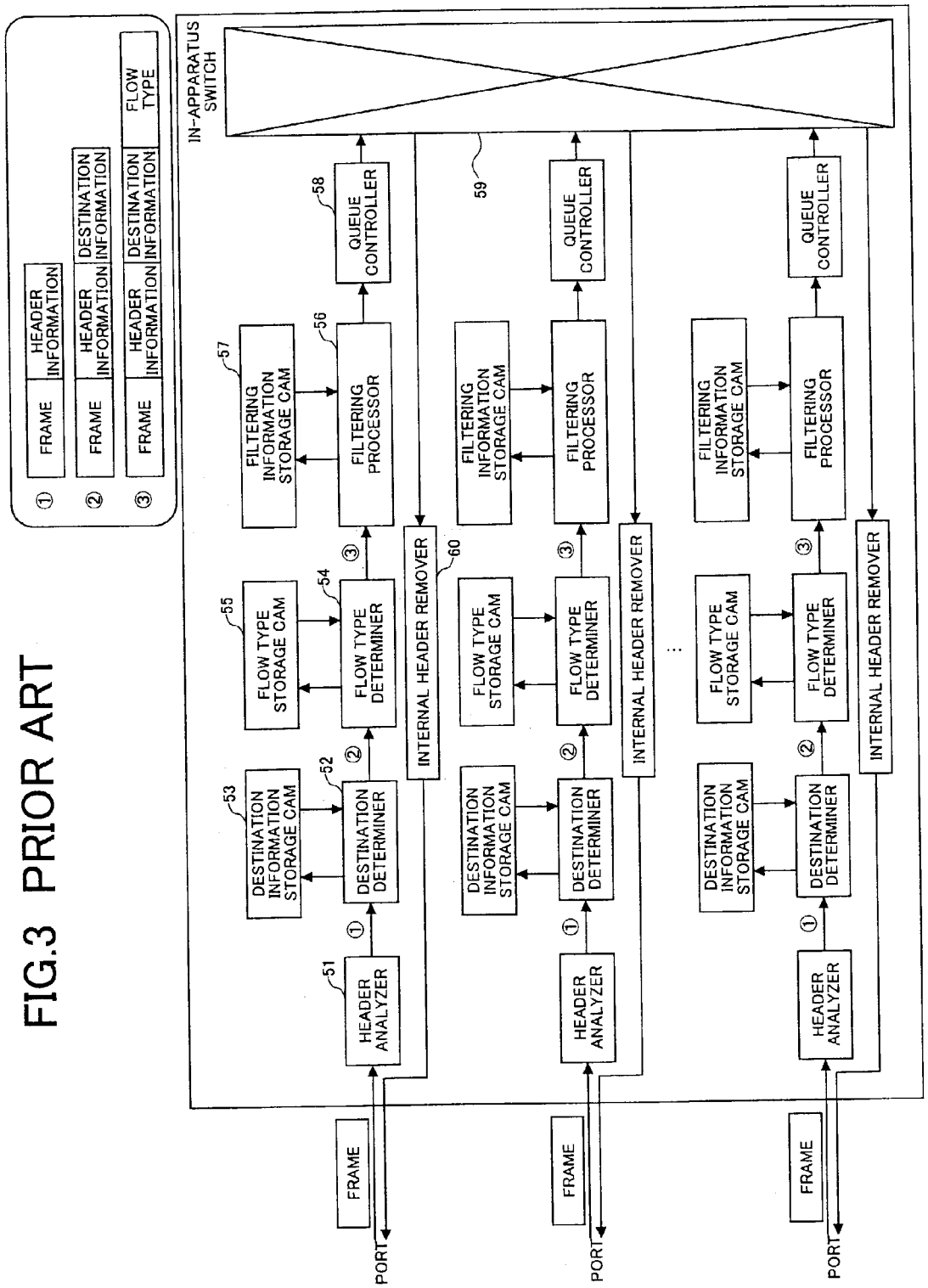
FIG. 3 is a block diagram of an example of a conventional intermediary apparatus.
Figure 12:
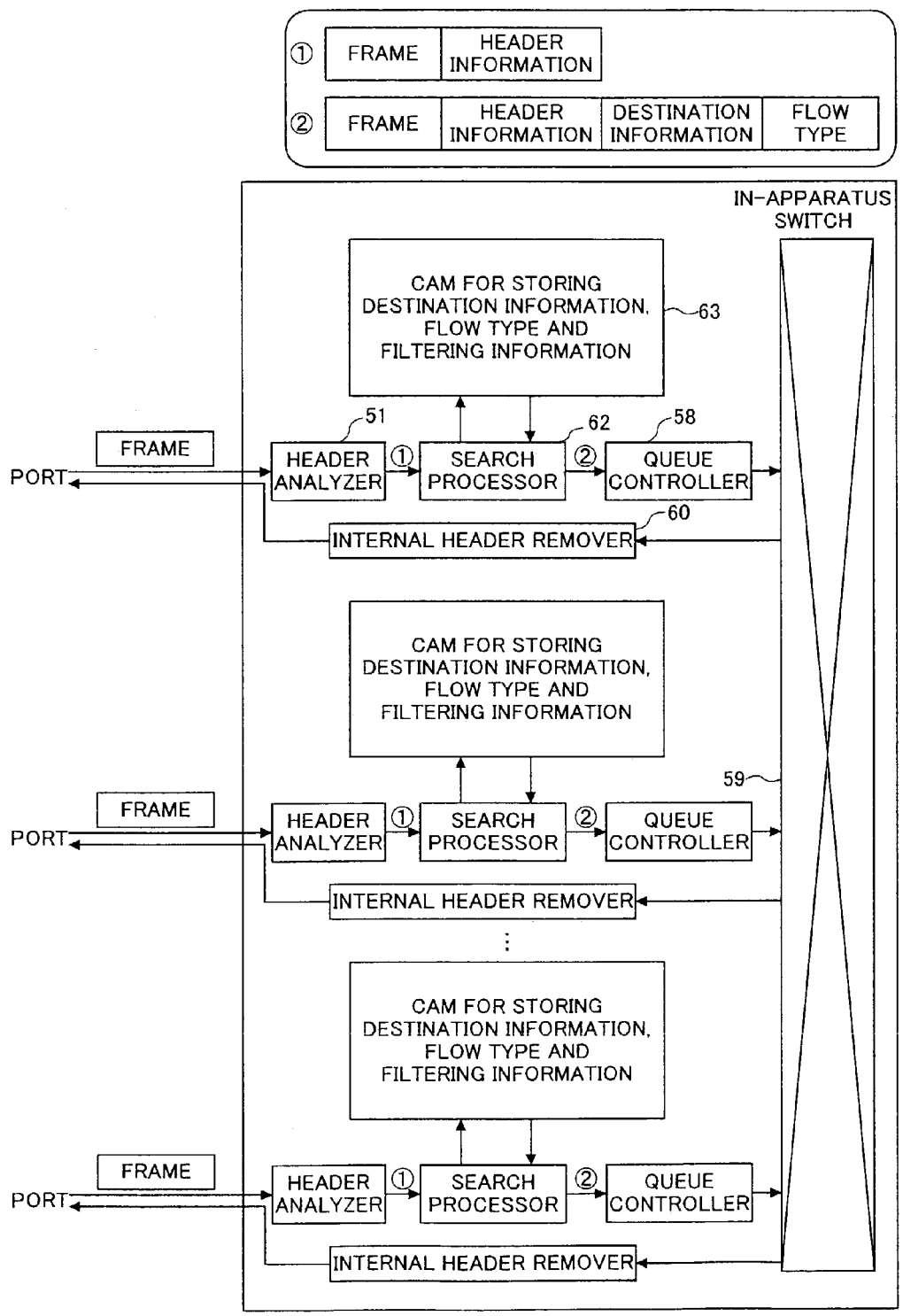
FIG. 12 is a block diagram of an embodiment of an intermediary apparatus using the associative memory device according to the present invention.

In contrast to the conventional intermediary apparatus shown in FIG. 3, the intermediary apparatus using the associative memory device according to the present invention has a structure shown in FIG. 12. This intermediary apparatus shown in FIG. 12 also performs three searching processes regarding a destination, a flow type and a filtering. First, in the header analyzer 51, header information is extracted from each frame supplied via the port, and is attached to the frame.

In a search processor 62, the header information is supplied to a CAM 63 connected thereto so as to obtain destination information, a flow type and filtering information. In the search processor 62, when the filtering information indicates that the frame is to be filtered, the frame is discarded so that the frame is not to be relayed to a subsequent stage.

Further, in the queue controller 58 at the subsequent stage, a priority control is performed according to priority information indicated by the flow type attached to the frame. The in-apparatus switch 59 switches the frame to a destination indicated by the destination information attached to the frame. Besides, in the internal header remover 60 subsequent to the in-apparatus switch 59, the header information, the destination information and the flow type are detached from the frame, and the frame is transmitted via the port.

Thus, since a plurality of search results can be obtained by making one search input to one CAM (the CAM 63), the intermediary apparatus according to the present invention has advantages in terms of a cost and a mounting area. Besides, upon providing functional extensions for a conventional intermediary apparatus as shown in FIG. 3 in which the CAMs are physically prepared in number corresponding to the number of searching processes, the conventional intermediary apparatus per se needs to be restructured; this hinders a flexible addition of functional extensions. In contrast, in the associative memory device according to the present invention, settings, such as the number of search results to be returned and the search object memory groups to which search results are to be returned, can be freely designated; therefore, in the present invention, the intermediary apparatus per se does not need to be restructured.

As described above, when a plurality of search results are desired to be obtained by supplying a single search key, for example when three types of searches including a destination search, a flow search and a filtering search are desired to be performed by using various header information extracted from a frame as a search key in the associative memory device of the present invention used in an intermediary apparatus for a network, all of search results can be returned by performing a search input only once; thus, the considerably long search key does not need to be input again and again which takes a long time.

Accordingly, a search time required for one frame is shortened so that one associative memory device can deal with an ultra high-speed line. Additionally, settings, such as the number of search results to be returned, can be freely designated; thus, the associative memory device according to the present invention can undergo various functional extensions flexibly.

The present invention is not limited to the specifically disclosed embodiments, and variations and modifications may be made without departing from the scope of the present invention.

The present application is based on Japanese priority application No. 2002-204561 filed on Jul. 12, 2002, the entire contents of which are hereby incorporated by reference.

What is claimed is:

1. A memory device for receiving data stored therein as a key, and returning an address at which said key is stored, the device comprising:

a memory including entries divided logically in a plurality of groups, and storing said data; and an instruction decoder decoding a search instruction designating a plurality of groups to be searched from among said plurality of groups so as to generate a group signal designating each of the groups to be searched and an enable signal, wherein said group signal, said enable signal and said key are supplied to said memory so as to search each of the groups designated by said group signal, and then successively return search results for each of the groups designated by said group signal.

2. The memory device as claimed in claim 1, wherein said search instruction includes a search object group designation pan designating at least one of said groups to be searched.

3. The memory device as claimed in claim 1, further comprising a search object group storage staring beforehand a designation of at least one of said groups to be searched.

4. The memory device as claimed in claim 2, further comprising a search object group storage storing beforehand a designation of at least one of said groups to be searched.

5. The memory device as claimed in claim 3, wherein said search instruction includes a search object group designation part designating least one of said groups to be searched, and wherein the group designated by said search object group designation part to be searched is searched when said search object group designation part designates said group to be searched even tough said search object group storage stores beforehand the designation of the group to be searched.

6. The memory device as claimed in claim 4, wherein the group designated by said search object group designation part to be searched is searched when said search object group designation part designates said group to be searched even though said search object group storage stores beforehand the designation of the group to be searched.

7. The memory device as claimed in claim 2, wherein said search instruction is provided successively a plurality of times so as to designate an order of returning the search results of at least one of said groups designated to be searched.

8. The memory device as claimed in claim 3, wherein said search object group storage stores beforehand a designation of an order of returning the search results of at least one of said groups designated to be searched.

9. The memory device as claimed in claim 4, wherein said search object group storage stores beforehand a designation of an order of returning the search results of at least one of said groups designated to be searched.

10. The memory device as claimed in claim 8, wherein said search results are returned in an order designated by said search instruction when said search instruction designates said order even though said search object group storage stores beforehand the designation of the order of returning said search results.

11. The memory device as claimed in claim 9, wherein said search results are returned in an order designated by said search instruction when said search instruction designates said order even though said search object group storage stores beforehand the designation of the order of returning said search results.

12. The memory device as claimed in claim 1, wherein each of said entries includes a group storage storing information identifying the memory group to which the entry belongs.

13. The memory device as claimed in claim 1, wherein each of said entries includes an entry storage storing a key of the entry.

14. The memory device as claimed in claim 1, further including a search start designator prohibiting a next search instruction from being accepted during a period required for returning all of the search results of at least one of said groups designated to be searched.

15. The memory device as claimed in claim 14, wherein said search start designator includes a search input interrupt designator storing a designation of accepting the next search instruction during said period, and causing said next search instruction to interrupt.

16. An intermediary apparatus comprising:
a memory device for receiving data stored therein as a key, and returning an address at which said key is stored, the device including:
a memory including entries divided logically in a plurality of groups, and storing said data; and
an instruction decoder decoding a search instruction designating a plurality of groups to be searched from among said plurality of groups so as to generate a group signal designating each of the groups to be searched and an enable signal,
wherein said group signal, said enable signal and said key are supplied to said memory so as to search each of the groups designated by said group signal, and then successively return search results for each of the groups designated by said group signal.

* * * * *